(12) United States Patent
Souma et al.

(10) Patent No.: US 11,874,300 B2
(45) Date of Patent: *Jan. 16, 2024

(54) CONTACT PROBE AND PROBE UNIT

(71) Applicant: NHK Spring Co., Ltd., Yokohama (JP)

(72) Inventors: Kazuya Souma, Kanagawa (JP); Tsukasa Sakaguchi, Kanagawa (JP)

(73) Assignee: NHK SPRING CO., LTD., Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/729,135

(22) Filed: Apr. 26, 2022

(65) Prior Publication Data
US 2022/0252640 A1  Aug. 11, 2022

Related U.S. Application Data

(63) Continuation of application No. 16/496,608, filed as application No. PCT/JP2018/013367 on Mar. 29, 2018, now Pat. No. 11,346,859.

(30) Foreign Application Priority Data

Mar. 30, 2017  (JP) .................... 2017-069272

(51) Int. Cl.
  *G01R 1/067* (2006.01)
(52) U.S. Cl.
  CPC ................. *G01R 1/06722* (2013.01)
(58) Field of Classification Search
  CPC .......... G01R 1/06722; G01R 1/06738
  See application file for complete search history.

(56) References Cited

U.S. PATENT DOCUMENTS

| 6,796,850 B2 | 9/2004 | Matsui et al. |
| 9,105,994 B2 | 8/2015 | Suzuki et al. |
| 2003/0016037 A1 | 1/2003 | Kazama |

(Continued)

FOREIGN PATENT DOCUMENTS

| CN | 1521895 A | 8/2004 |
| CN | 1529818 A | 9/2004 |

(Continued)

OTHER PUBLICATIONS

Office Action dated Jan. 11, 2019, issued for the TW Patent Application No. 107111290 and English translation thereof.

(Continued)

*Primary Examiner* — Lee E Rodak
(74) *Attorney, Agent, or Firm* — Locke Lord LLP

(57) ABSTRACT

A contact probe includes: a first contact member; a second contact member; and a spring member. The first contact member includes: a first tip part configured to contact a first contact target; and a boss part configured to couple with the spring member by fitting into the spring member, and the second contact member includes: a second tip part configured to contact a second contact target; and a cylindrical part extending from the second tip part and having a cylindrical shape with an inner circumference having a uniform diameter, the cylindrical part being engaged with at least a portion of the spring member, the portion of the spring member that is engaged with the cylindrical part having a diameter larger than the other portion of the spring member, the entire spring member being configured to be housed in the cylindrical part when the spring member is contracted.

14 Claims, 8 Drawing Sheets

(56) References Cited

U.S. PATENT DOCUMENTS

2003/0137316 A1   7/2003  Kazama
2003/0176113 A1   9/2003  Sasaki
2004/0140821 A1   7/2004  Lee
2004/0161981 A1   8/2004  Matsui et al.
2004/0239355 A1   12/2004 Kazama
2011/0221464 A1   9/2011  Nagata et al.
2013/0099814 A1   4/2013  Kazama et al.

FOREIGN PATENT DOCUMENTS

| CN | 102959406   A  | 3/2013  |
|----|----------------|---------|
| JP | 2002-056915 A  | 2/2002  |
| JP | 2004-226397 A  | 8/2004  |
| JP | 2004-247170 A  | 9/2004  |
| JP | 2005-069805 A  | 3/2005  |
| JP | 2008-014704 A  | 1/2008  |
| JP | 2008-130283 A  | 6/2008  |
| JP | 5083430      B2| 11/2012 |
| JP | 2015-121476 A  | 7/2015  |
| KR | 20170008531 A  | 1/2017  |
| TW | 200413732   A  | 8/2004  |
| TW | M356909     U1 | 5/2009  |
| TW | M356910     U1 | 5/2009  |
| TW | M500367     U  | 5/2015  |
| WO | 2012/093479 A1 | 7/2012  |

OTHER PUBLICATIONS

International Search Report dated Jun. 26, 2018, issued for PCT/JP2018/013367.
Office Action dated Sep. 24, 2019, issued for the Japanese Patent Application No. 2019-510162 and an English machine translation thereof.
Office Action dated Feb. 1, 2021, issued for Chinese Patent Application No. 201880021388X and English translation thereof.

CONTACT PROBE AND PROBE UNIT

This application is a continuation of U.S. application Ser. No. 16/496,608 filed on Sep. 23, 2019 which is U.S. National Phase Application of PCT/JP2018/013367, filed on Mar. 29, 2018, and claims the benefit of priority from Japanese Patent Application No. 2017-069272 filed on Mar. 30, 2017, the entire contents of which are incorporated herein by reference.

BACKGROUND

The present disclosure relates to a contact probe and a probe unit that are used for conductivity test or performance characteristic test on inspected test target such as a semiconductor integrated circuit or liquid crystal panel.

In the related art, at the time of conductivity test or performance characteristic test on inspected test target such as a semiconductor integrated circuit or liquid crystal panel, a probe unit for housing a plurality of contact probes has been used to realize an electrical connection between the test target and a signal processing device for outputting a test signal. With regard to probe units, a technique of allowing application to a high-integrated or miniaturized test target by narrowing a pitch between contact probes has been developed in accordance with progress of high integration or miniaturization of semiconductor integrated circuits and liquid crystal panels of recent years.

As the contact probes mentioned above, a contact probe including a pipe member, a plunger that extends from the pipe member in a manner capable of freely moving back and forth, and a spring member that is provided inside the pipe member for biasing the plunger, has been known (for example, see Japanese Patent No. 5083430). In Patent Literature 1, the plunger is prevented from falling off by swaging an end part of the pipe member from which the plunger extends.

SUMMARY

However, in the known contact probe disclosed in Patent Literature 1, when the diameter of the pipe member is reduced to miniaturize the contact probe, strength of the pipe member is degraded. There has been a problem in that, due to degradation of strength of the pipe member, the end part cannot be swaged, and the contact probe having a reduced diameter cannot be obtained.

There is a need for a contact probe and a probe unit that can achieve a reduced diameter in a configuration using a pipe member.

According to one aspect of the present disclosure, there is provided a contact probe including: a first contact member configured to contact a first contact target; a second contact member configured to contact a second contact target, and house at least a portion of the first contact member; and a spring member configured to couple the first contact member and the second contact member in a manner capable of expansion/contraction with both end parts of the spring member, wherein the spring member is wound in a helical shape, and at least a diameter of an outer circumference in one of the end parts held by the second contact member is larger than diameters of other portions, a diameter of an inner circumference of an end part of the second contact member on a side housing the first contact member is equal to or larger than a maximum diameter of the first contact member, the first contact member includes: a first tip part configured to contact the first contact target; and a boss part configured to couple with the spring member by fitting into the spring member, and the second contact member includes: a second tip part configured to contact the second contact target; and a cylindrical part extending from the second tip part and having a cylindrical shape with an inner circumference having a uniform diameter, the cylindrical part being engaged with at least a portion of the spring member, the portion of the spring member that is engaged with the cylindrical part having a diameter larger than the other portion of the spring member, the entire spring member being configured to be housed in the cylindrical part when the spring member is contracted.

DETAILED DESCRIPTION

Embodiments of the present disclosure will now be described in detail with reference to the attached drawings. The present disclosure is not limited to the following embodiments. In addition, each of the figures referred to in the following descriptions merely schematically illustrates the shapes, sizes, and positional relations in a degree that allows understanding of the contents of the present disclosure. Accordingly, the present disclosure is not limited only to the shapes, sizes, and positional relations exemplified in each of the figures.

First Embodiment

Figure 1:
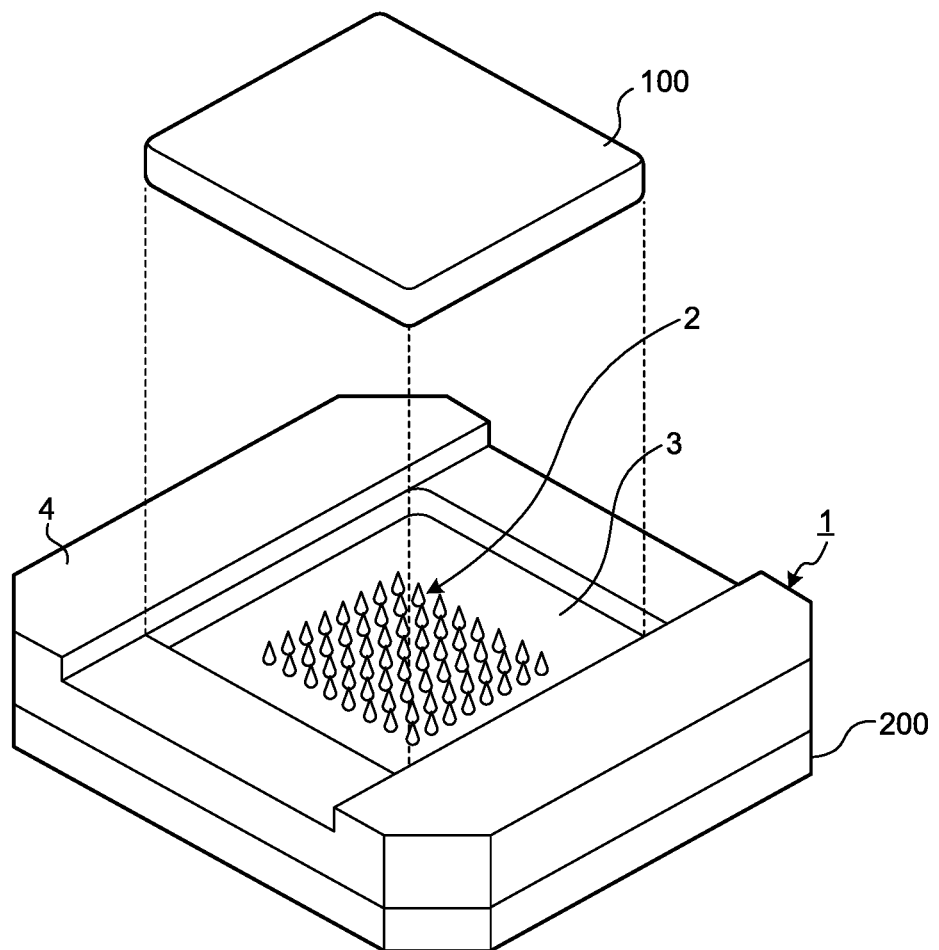
FIG. 1 is a perspective view illustrating a configuration of a probe unit according to a first embodiment of the present disclosure.

FIG. 1 is a perspective view illustrating a configuration of a probe unit according to a first embodiment of the present disclosure. A probe unit 1 illustrated in FIG. 1 is a device that is used when performing electrical property test on a semiconductor integrated circuit 100 that is inspected test target, and is a device for electrically connecting the semiconductor integrated circuit 100 and a circuit board 200 that outputs a test signal to the semiconductor integrated circuit 100. The probe unit 1 includes a conductive contact probe 2 (hereinafter simply referred to as the "probe 2") that contacts, at both ends in the longitudinal direction, the semiconductor integrated circuit 100 and the circuit board 200, which are two contact targets different from each other, a probe holder 3 that houses and holds a plurality of the probes 2 according to a predetermined pattern, and a holder member 4 that is provided in the surrounding of the probe holder 3 for suppressing occurrence of dislocation of the semiconductor integrated circuit 100 contacting the probes 2 at the time of test. For example, a distance (pitch) between adjacent probes 2 is 0.8 mm.

Figure 2:
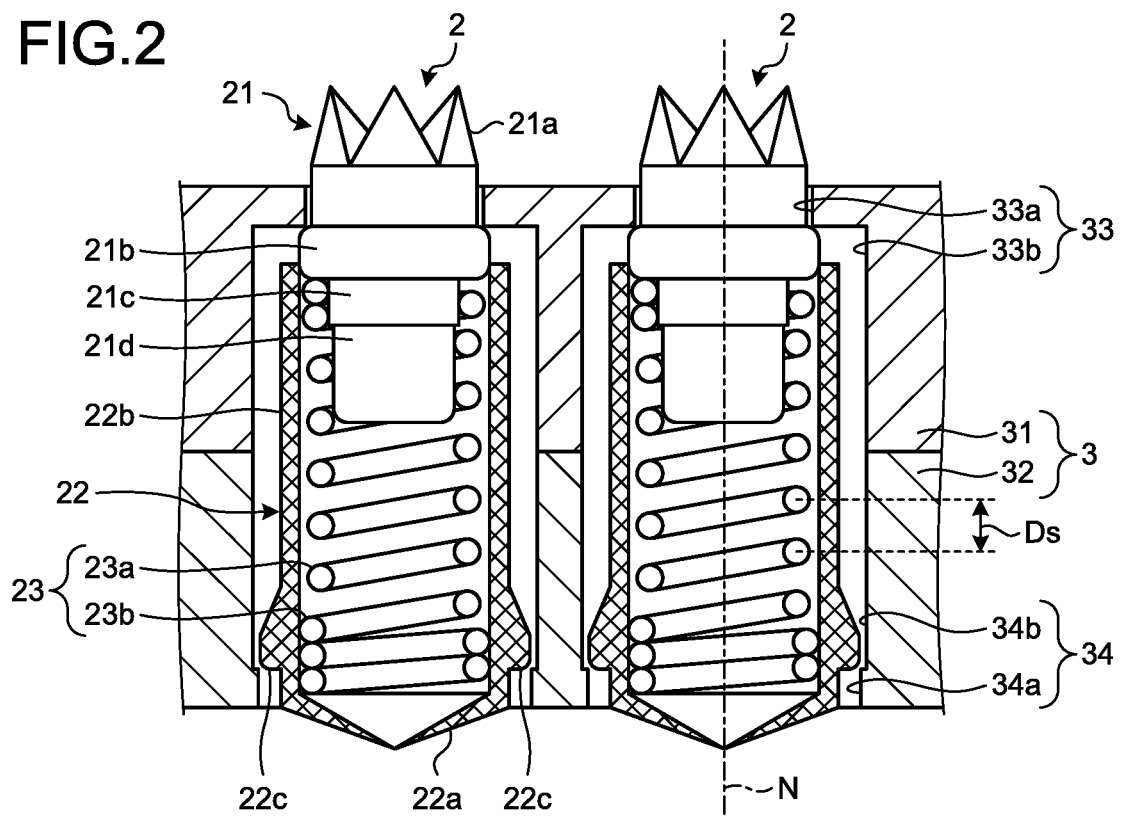
FIG. 2 is a partial sectional view illustrating a configuration of a chief part of the probe unit according to the first embodiment of the present disclosure.
Figure 3:
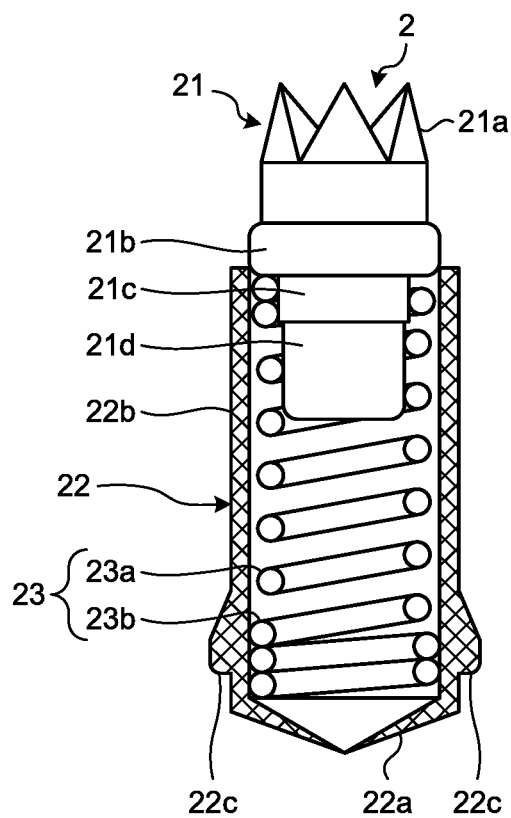
FIG. 3 is a partial sectional view illustrating a configuration of a contact probe according to the first embodiment of the present disclosure.

FIG. 2 is a partial sectional view illustrating a configuration of a chief part of the probe unit according to the first embodiment of the present disclosure, and is a figure illustrating a detailed configuration of the probe 2 housed in the probe holder 3. FIG. 3 is a partial sectional view illustrating a configuration of a contact probe according to the first embodiment of the present disclosure. The probe 2 illustrated in FIG. 3 is in a state in which a load other than gravity force is not applied from the outside. The probe 2 illustrated in FIG. 2 and FIG. 3 is formed with a conductive material, and it includes a plunger 21 that contacts a connection electrode of the semiconductor integrated circuit 100 when performing test on the semiconductor integrated circuit 100, a pipe member 22 that contacts an electrode of the circuit board 200 having a test circuit, and a spring member 23 that couples the plunger 21 and the pipe member 22 in a manner capable of expansion and contraction with both end parts. The plunger 21, the pipe member 22, and the spring member 23 constituting the probe 2 have the same axial line. Specifically, with regard to the plunger 21, the pipe member 22, and the spring member 23, each of the central axes thereof matches an axial line N (see FIG. 2). The match mentioned here includes a certain degree of inclinations. At the time of contact of the semiconductor integrated circuit 100, the probe 2 reduces the impact on the connection electrode of the semiconductor integrated circuit 100 with expansion/contraction of the spring member 23 in the axial line N direction, and applies a load to the semiconductor integrated circuit 100 and the circuit board 200.

The plunger 21 includes a tip part 21a having a crown shape, a flange part 21b having a larger diameter than the diameter of the tip part 21a, a boss part 21c into which an end part of the spring member 23 is press-fitted, that extends to the opposite side to the tip part 21a with respect to the flange part 21b and has a smaller diameter than the flange part 21b does, and a base end part 21d that extends to the opposite side to the flange part 21b with respect to the boss part 21c and has a diameter slightly smaller than the diameter of the boss part 21c. The plunger 21 is capable of moving in the axial line direction with expansion/contraction action of the spring member 23, and is biased in the direction of the semiconductor integrated circuit 100 with elastic force of the spring member 23, thereby contacting the electrode of the semiconductor integrated circuit 100. The diameter mentioned here refers to the diameter of the circle in a cross-section surface having a flat surface as the cutting surface orthogonal to the axial line N. In addition, the boss part 21c only needs to be coupled with the spring member 23, and the boss part 21c and the spring member 23 are only required to be at least fitted to each other such as being coupled by forming a groove that conforms with the spring member 23 in the boss part 21c besides press fitting.

The tip part 21a has a crown shape with a plurality of claw parts. The claw parts project, for example, in the same pyramid shape as one another. Besides the crown shape, the tip shape of the tip part 21a may have a conical shape, a planar shape, or a flat plate shape.

With regard to the flange part 21b, an end part on the opposite side to the side continuous to the tip part 21a has a tapered shape. If a portion of the flange part 21b is housed in the pipe member 22 at the time of arrangement on the probe holder 3, or if a portion of the flange part 21b is housed in the pipe member 22 when a load other than gravity force is not applied, as in the case of the first embodiment, a tapered shape may not be provided.

The pipe member 22 has a bottomed cylindrical shape. The pipe member 22 includes a tip part 22a having a sharp end abutting on the electrode formed on the circuit board 200, a cylindrical part 22b having a cylindrical shape that extends from the base end of the tip part 22a, and a flange part 22c that projects from the outer surface of the cylindrical part 22b.

The tip part 22a becomes thinner toward the tip. The diameter of the outer circumference of the cylindrical part 22b is, for example, 0.4 mm or larger and 0.65 mm or smaller. In addition, the diameter of the inner circumference of the cylindrical part 22b is uniform, and is equal to or larger than the diameter of the flange part 21b. The "equal" mentioned here includes manufacturing errors, and tolerance including a diameter in which the flange part 21b is slidable.

The flange part 22c has a tapered shape in which the projection length becomes shorter from the tip part 22a side to the opposite side.

The spring member 23 is made by, for example, winding one and the same wire material. The spring member 23 includes a rough wound part 23a that is made by winding the wire material at a predetermined pitch, and a dense wound part 23b that is provided at an end part on the side abutting on the pipe member 22. With regard to the rough wound part 23a, a gap Ds of the wire materials adjacent to each other in the axial line N direction has a previously set length. With regard to the dense wound part 23b, the wire materials adjacent to each other in the axial line N direction are in contact with each other. The diameter of the outer circumference of the rough wound part 23a is smaller than the diameter of the outer circumference of the dense wound part 23b. With regard to the spring member 23, for example, when a load other than gravity force is not applied, the diameter of the inner circumference of the rough wound part 23a is equal to or smaller than the diameter of the boss part 21c, and the diameter of the outer circumference of the dense wound part 23b is equal to or larger than the diameter of the inner peripheral surface of the cylindrical part 22b. An end part of the rough wound part 23a is press-fitted into the boss part 21c, and it abuts on the flange part 21b. With regard to a portion that is press-fitted into the boss part 21c of the rough wound part 23a, the pitch between the wire materials adjacent in the axial line N direction may be small, or they may be in contact. Meanwhile, the dense wound part 23b is, for example, held by being press-fitted into the inner peripheral surface in the vicinity of the boundary between the tip part 22a and the cylindrical part 22b. The plunger 21 and the spring member 23 are joined by winding force of a spring and/or soldering. In addition, the pipe member 22 and the spring member 23 are joined by pressure welding and/or soldering.

In the first embodiment, the length of the spring member 23 of the contact probe 2 in the natural state thereof in the central axis (axial line N) direction is smaller than the length of the cylindrical part 22b in the central axis (axial line N) direction (see FIG. 3). Thus, when being arranged on the probe holder 3 with no load applied from the semiconductor integrated circuit 100 and the circuit board 200, at least a portion of the flange part 21b is positioned inside the cylindrical part 22b in the probe 2 in the natural state thereof. The natural state mentioned here refers to a state in which a load other than gravity force is not applied.

Since the pipe member 22 is not swaged in the probe 2 according to the first embodiment, the probe 2 can be created even when the diameter is reduced.

The probe holder 3 is formed with an insulating material such as resin, machinable ceramic, or silicon, and is made by laminating a first member 31 that is positioned on the upper surface side and a second member 32 that is positioned on the lower surface side in FIG. 2. The same number of holder holes 33, 34 for housing the probes 2 are formed in the first member 31 and the second member 32, and the holder holes 33, 34 for housing the probes 2 are formed such that their axial lines match each other. The positions at which the holder holes 33, 34 are formed are determined in accordance with a wiring pattern of the semiconductor integrated circuit 100.

The holder holes 33, 34 both have a stepped hole shape having different diameters along the penetrating direction. That is to say, the holder hole 33 has a small-diameter part 33a having an opening on the upper end surface of the probe holder 3, and a large-diameter part 33b having a larger diameter than the small-diameter part 33a. Meanwhile, the holder hole 34 has a small-diameter part 34a having an opening on the lower end surface of the probe holder 3, and a large-diameter part 34b having a larger diameter than the small-diameter part 34a. The shapes of these holder holes 33, 34 are determined in accordance with the configuration of the probe 2 to be housed. The flange part 21b of the plunger 21 abuts on the boundary wall surface between the small-diameter part 33a and the large-diameter part 33b of the holder hole 33 to provide a function to prevent the probe 2 from falling off from the probe holder 3. In addition, the flange part 22c of the pipe member 22 abuts on the boundary wall surface between the small-diameter part 34a and the large-diameter part 34b of the holder hole 34 to provide a function to prevent the probe 2 from falling off from the probe holder 3.

Figure 4A:
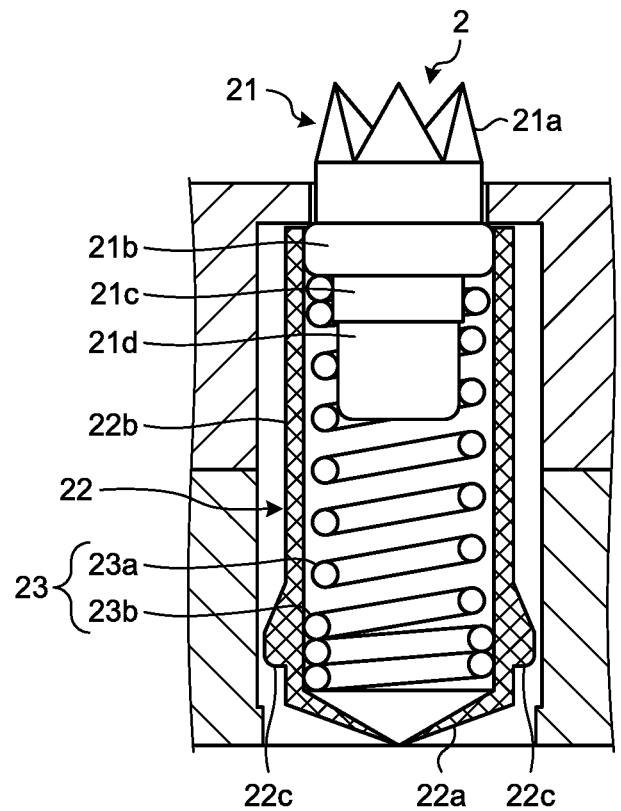
FIG. 4A is a figure explaining a contracted mode of the contact probe according to the first embodiment of the present disclosure.
Figure 4B:
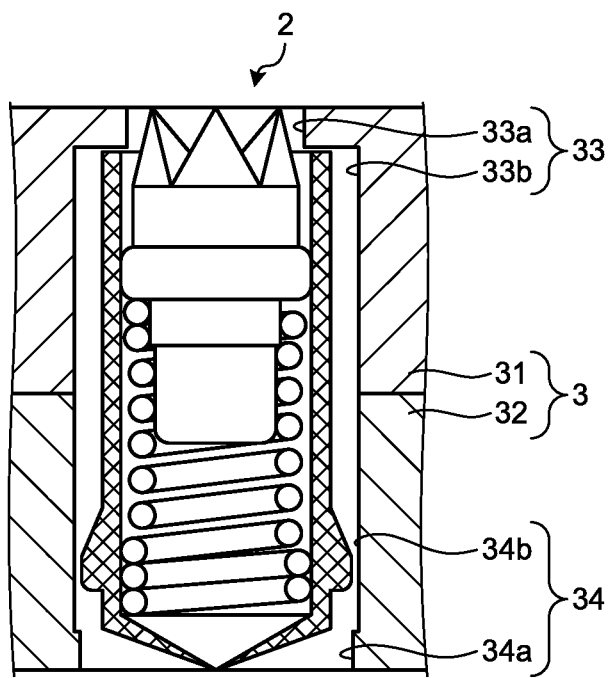
FIG. 4B is a figure explaining the contracted mode of the contact probe according to the first embodiment of the present disclosure.

FIG. 4A and FIG. 4B are figures for explaining a contracted mode of the contact probe according to the first embodiment of the present disclosure. FIG. 4A is a figure illustrating a state in which the pipe member 22 contacts the circuit board 200, and a load is not applied to the tip part 21a of the plunger 21. FIG. 4B is a figure illustrating a test state in which the semiconductor integrated circuit 100 is brought into contact with respect to the state illustrated in FIG. 4A.

When a load is not applied to the probe unit 1 from the semiconductor integrated circuit 100 and the circuit board 200, as illustrated in FIG. 2, in the probe 2, the flange part 21b is locked on the step part of the holder hole 33 and the flange part 22c is locked on the step part of the holder hole 34. At this time, a portion of the flange part 21b is housed inside the cylindrical part 22b. Thus, mismatch of the axial line of the plunger 21 and the axial line of the pipe member 22 can be prevented. Although FIG. 2 illustrates a state in which the probe 2 is held by the probe holder 3, the length in the axial line N direction of the probe 2 that is removed from the probe holder 3 may become longer than the length in the axial line N direction in the state of FIG. 2.

As illustrated in FIG. 4A, when the circuit board 200 is attached to the probe unit 1, the pipe member 22 receives a load from the circuit board 200, and is housed inside the probe holder 3. At this time, the end part on the opposite side to the tip part 22a side of the cylindrical part 22b approaches the step part made by the small-diameter part 33a and the large-diameter part 33b.

When the plunger 21 is brought into contact with the semiconductor integrated circuit 100 in the state of FIG. 4A, as illustrated in FIG. 4B, the plunger 21 receives a load from the semiconductor integrated circuit 100, and enters the inside of the pipe member 22. At this time, a portion of the plunger 21 contacts the cylindrical part 22b due to, for example, an inclination caused by the received load. A test signal that is supplied from the circuit board 200 to the semiconductor integrated circuit 100 at the time of test on the semiconductor integrated circuit 100 as illustrated in FIG. 4B, reaches the connection electrode of the semiconductor integrated circuit 100 from the electrode of the circuit board 200 via the pipe member 22 and the plunger 21 of the probe 2. In this manner, since conduction is performed via the plunger 21 and the pipe member 22 in the probe 2, a conduction path of the electrical signal can be minimized.

According to the first embodiment mentioned above, in the probe 2 including the plunger 21, the pipe member 22, and the spring member 23, the spring member 23 is arranged inside the cylindrical part 22b having a uniform diameter, and the spring member 23 is coupled with the plunger 21. Thus, the probe 2 can be created without requiring swaging of the pipe member 22, and the reduction of a diameter can be realized in the configuration using the pipe member. In the probe 2 according to the first embodiment, one end part of the spring member 23 holds the boss part 21c, and the other end part is held by the cylindrical part 22b. Thus, the spring member 23 prevents the plunger 21 from being detached from the pipe member 22. Meanwhile, in a configuration of creating a probe by swaging a pipe member as in conventional techniques, creation may not be possible since swaging is difficult if the diameter of the pipe member is about 0.4 mm.

(First Modification of First Embodiment)

Figure 5:
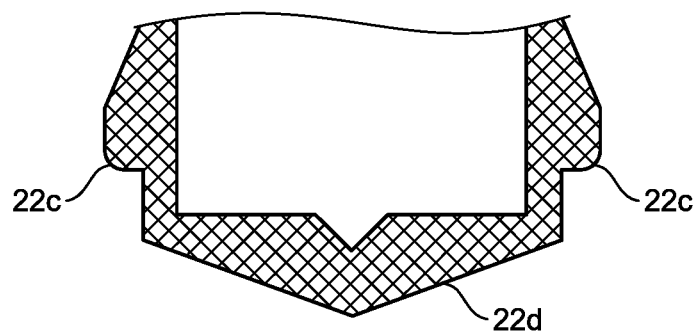
FIG. 5 is a sectional view illustrating a configuration of a chief part of a contact probe according to a first modification of the first embodiment of the present disclosure.

FIG. 5 is a sectional view illustrating a configuration of a chief part of a contact probe according to a first modification of the first embodiment of the present disclosure. The first embodiment mentioned above describes the tip part 22a becoming thinner toward its tip. However, it is not limited thereto. In order to increase the strength of the tip part of the pipe member 22, a thicker thickness is preferable. For example, the thickness of the tip may be made thick as in a tip part 22d illustrated in FIG. 5 by cutting with a sweep cut drill. Furthermore, the shape of the tip part may have a crown shape, a column shape, or a cylindrical shape, besides a pyramid shape as illustrated in FIG. 2 and FIG. 5. A through hole that penetrates in the axial line N direction may also be formed at the tip of the tip part 22a.

(Second Modification of First Embodiment)

Figure 6:
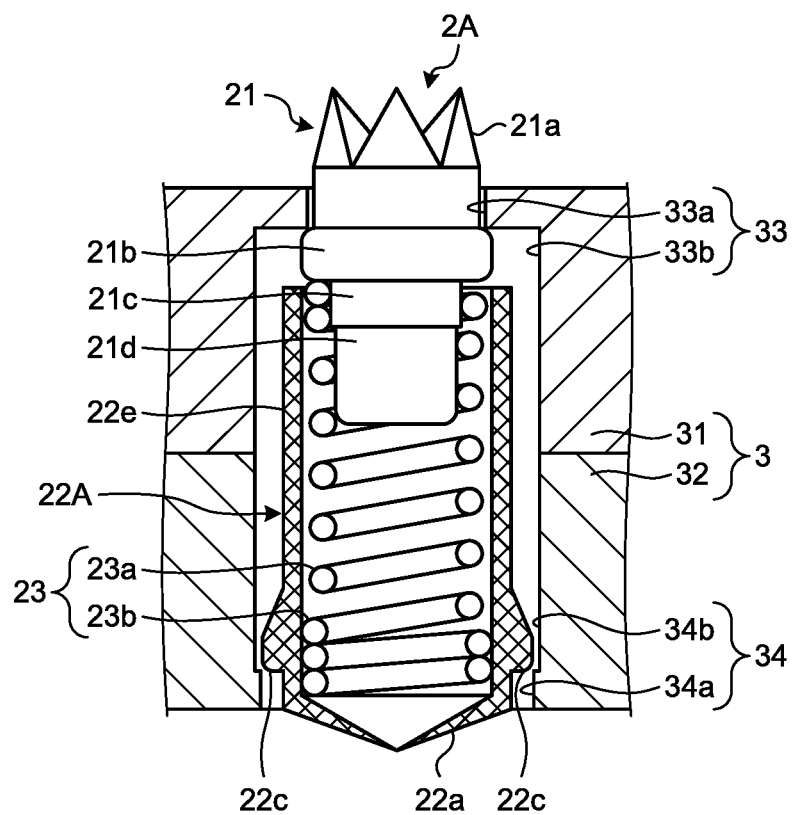
FIG. 6 is a partial sectional view illustrating a configuration of a chief part of a probe unit according to a second modification of the first embodiment of the present disclosure.
Figure 7:
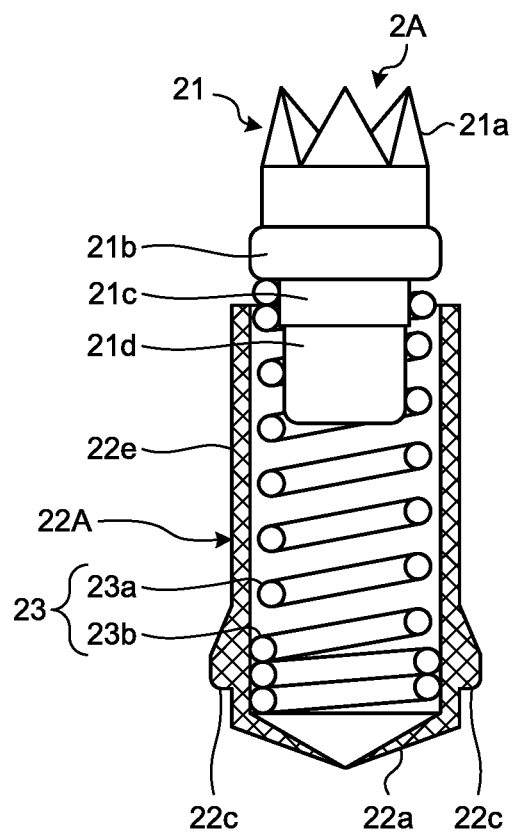
FIG. 7 is a partial sectional view illustrating a configuration of a contact probe according to the second modification of the first embodiment of the present disclosure.

FIG. 6 is a partial sectional view illustrating a configuration of a chief part of a probe unit according to a second modification of the first embodiment of the present disclosure. FIG. 7 is a partial sectional view illustrating a configuration of a contact probe according to the second modification of the first embodiment of the present disclosure. A probe 2A illustrated in FIG. 7 is in a state in which a load other than gravity force is not applied from the outside. In the first embodiment mentioned above, when a load from the semiconductor integrated circuit 100 and the circuit board 200 is not applied to the probe unit 1, a portion of the flange part 21b of the probe 2 is housed inside the cylindrical part 22b. However, it is not limited thereto. For example, as in the case of the probe 2A illustrated in FIG. 6, when a load from the semiconductor integrated circuit 100 and the circuit board 200 is not applied to the probe unit 1, the flange part 21b may be positioned outside the pipe member. The probe 2A includes a pipe member 22A instead of the pipe member 22 in the probe 2 mentioned above. The pipe member 22A includes a cylindrical part 22e instead of the cylindrical part 22b of the pipe member 22. The length of the cylindrical part 22e in the axial line direction is shorter than that of the cylindrical part 22b.

In the second modification, the length of the spring member 23 of the contact probe 2A in the natural state thereof in the central axis (axial line N) direction is made longer than the length of the cylindrical part 22e in the central axis (axial line N) direction (see FIG. 7). Thus, when being arranged on the probe holder 3 with no load applied from the semiconductor integrated circuit 100 and the circuit board 200, the flange part 21b is positioned outside the cylindrical part 22e in the probe 2A in the natural state thereof. In this case, the plunger 21 can smoothly advance into the pipe member 22A by shaping the end part on the opposite side to the tip part 21a side of the flange part 21b in a tapered shape.

(Third Modification of First Embodiment)

Figure 8:
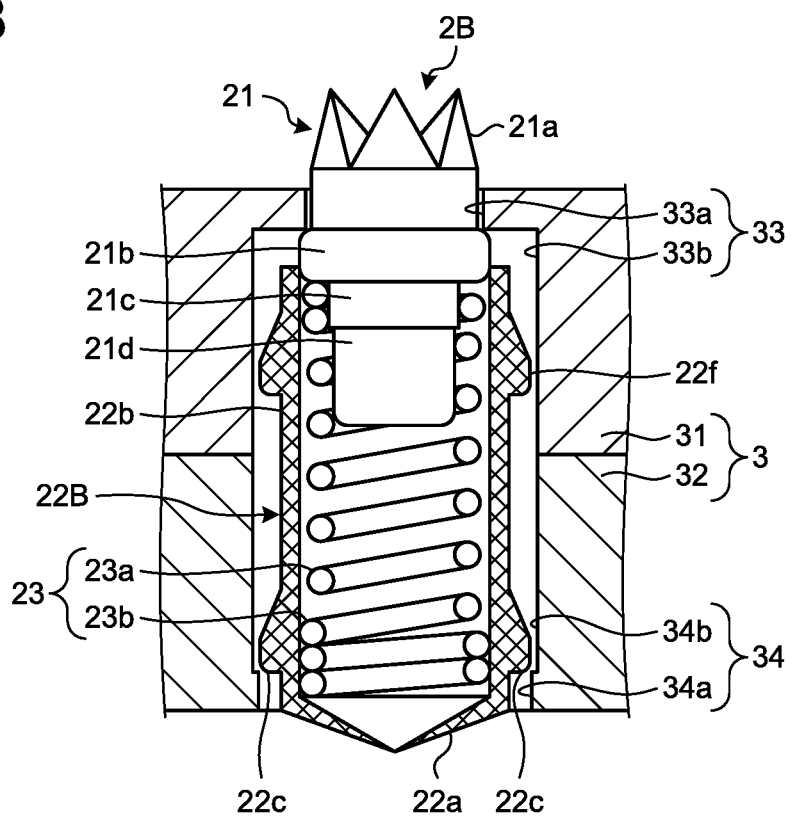
FIG. 8 is a partial sectional view illustrating a configuration of a chief part of a probe unit according to a third modification of the first embodiment of the present disclosure.

FIG. 8 is a partial sectional view illustrating a configuration of a chief part of a probe unit according to a third modification of the first embodiment of the present disclosure. A probe 2B according to the third modification includes a pipe member 22B instead of the pipe member 22 of the probe 2 mentioned above. The pipe member 22B includes a second flange part 22f in addition to the configuration of the pipe member 22 mentioned above. The second flange part 22f is provided at the end part of the cylindrical part 22b that is on the opposite side of the side continuous to the tip part 22a. In this manner, when the probe 2B is housed in the holder holes 33, 34, an inclination of the probe 2B can be suppressed.

(Fourth Modification of First Embodiment)

Figure 9:
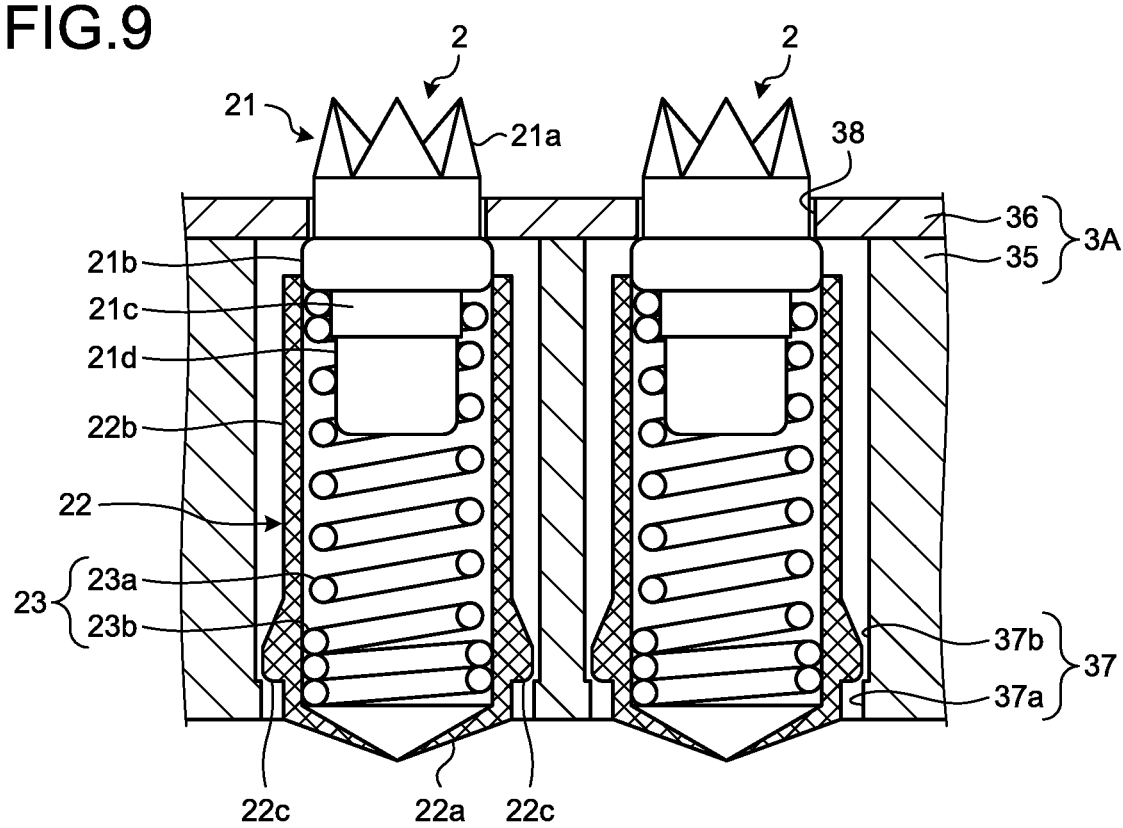
FIG. 9 is a partial sectional view illustrating a configuration of a chief part of a probe unit according to a fourth modification of the first embodiment of the present disclosure.

FIG. 9 is a partial sectional view illustrating a configuration of a chief part of a probe unit according to a fourth modification of the first embodiment of the present disclosure. In the first embodiment mentioned above, the probe holder 3 has the first member 31 in which the holder hole 33 having a stepped hole shape is formed, and the second member 32 in which the holder hole 34 having a stepped shape is formed. However, it is not limited thereto. As illustrated in FIG. 9, it is also applicable to a probe holder 3A that includes a first member 35 in which a plurality of holder holes 37 having stepped shapes are formed, and a second member 36 in which a plurality of holder holes 38 having uniform diameters are formed. The holder holes 37, 38 for housing the probes 2 are formed such that their axial lines match each other.

The holder hole 37 has a stepped hole shape with varying diameters along the penetrating direction. Specifically, the holder hole 37 has a small-diameter part 37a having an opening on the lower end surface of the probe holder 3, and a large-diameter part 37b having a larger diameter than the small-diameter part 37a. The holder hole 38 has a diameter that is smaller than the large-diameter part 37b and larger than the tip part 21a.

The flange part 21b of the plunger 21 abuts on the boundary wall surface between the large-diameter part 37b of the holder hole 37 and the holder hole 38 to provide a function to prevent the probe 2 from falling off from the probe holder 3. In addition, the flange part 22c of the pipe member 22 abuts on the boundary wall surface between the small-diameter part 37a and the large-diameter part 37b of the holder hole 37 to provide a function to prevent the probe 2 from falling off from the probe holder 3.

(Fifth Modification of First Embodiment)

Figure 10:
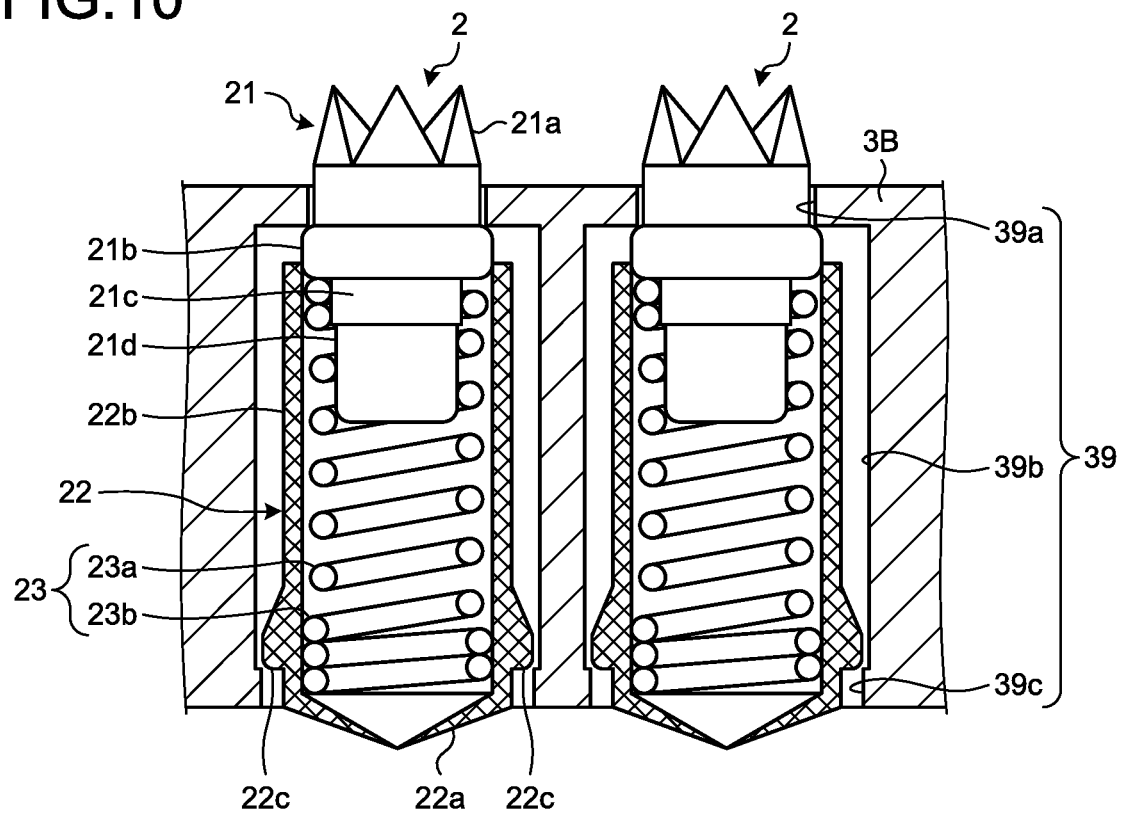
FIG. 10 is a partial sectional view illustrating a configuration of a chief part of a probe unit according to a fifth modification of the first embodiment of the present disclosure.

FIG. 10 is a partial sectional view illustrating a configuration of a chief part of a probe unit according to a fifth modification of the first embodiment of the present disclosure. In the first embodiment mentioned above, the probe holder 3 includes the first member 31 in which the holder hole 33 having a stepped shape is formed, and the second member 32 in which the holder hole 34 having a stepped shape is formed. However, it is not limited thereto. As illustrated in FIG. 10, it is also applicable to a probe holder 3B that is made of a single plate.

The probe holder 3B is formed with an elastically deformable insulating material such as resin or silicon. The probe holder 3B has a plurality of holder holes 39 for housing the probes 2. The positions at which the holder holes 39 are formed are determined in accordance with a wiring pattern of the semiconductor integrated circuit 100.

The holder hole 39 has a stepped hole shape with varying diameters along the penetrating direction. Specifically, the holder hole 39 has a first small-diameter part 39a having an opening on the upper end surface of the probe holder 3B, a large-diameter part 39b having a larger diameter than the first small-diameter part 39a, and a second small-diameter part 39c having an opening on the lower end surface of the probe holder 3. The diameter of the second small-diameter part 39c is larger than the diameter of the outer circumference of the cylindrical part 22b, and is smaller than the maximum diameter of the flange part 22c. The shapes of the holder holes 39 are determined in accordance with the configuration of the probes 2 to be housed. The flange part 21b of the plunger 21 abuts on the boundary wall surface between the first small-diameter part 39a and the large-diameter part 39b to provide a function to prevent the probe 2 from falling off from the probe holder 3B. In addition, the flange part 22c of the pipe member 22 abuts on the boundary wall surface between the large-diameter part 39b and the second small-diameter part 39c, to provide a function to prevent the probe 2 from falling off from the probe holder 3B.

When arranged in the probe holder 3B, the probe 2 is inserted into the second small-diameter part 39c from the plunger 21 side. At this time, the second small-diameter part 39c deforms due to press fit of the flange part 22c, and then returns to its original shape. In this manner, the second small-diameter part 39c is engaged with the flange part 22c while the probe 2 is arranged inside the holder hole 39, thereby providing a function to prevent the probe 2 from falling off from the probe holder 3B.

In addition, since the flange part 22c has a tapered shape in the fifth modification, insertability into the holder hole 39, especially the second small-diameter part 39c, can be improved.

(Sixth Modification of First Embodiment)

Figure 11:
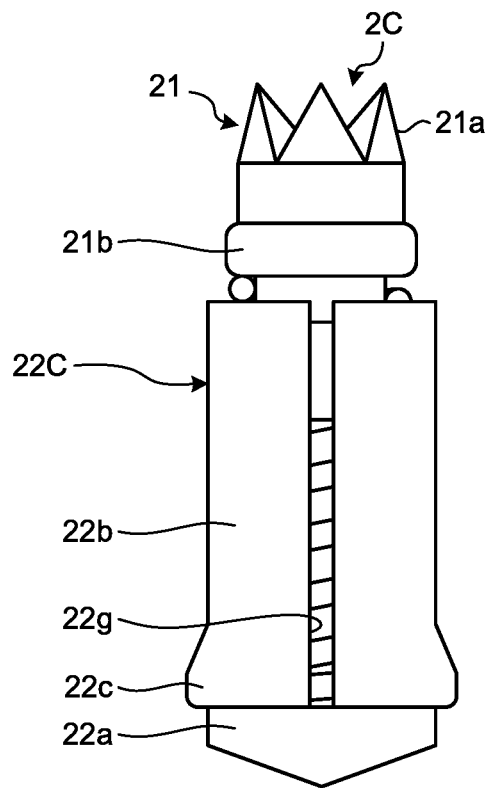
FIG. 11 is a partial sectional view illustrating a configuration of a contact probe according to a sixth modification of the first embodiment of the present disclosure.

FIG. 11 is a partial sectional view illustrating a configuration of a contact probe according to a sixth modification of the first embodiment of the present disclosure. A probe 2C illustrated in FIG. 11 is in a state in which a load other than gravity force is not applied from the outside. The probe 2C according to the sixth modification includes a pipe member 22C instead of the pipe member 22 of the probe 2 mentioned above. The pipe member 22C is such a member having a slit 22g in the cylindrical part 22b of the pipe member 22 mentioned above. The slit 22g is provided from the end part of the cylindrical part 22b that is on the opposite side to the side continuous to the tip part 22a, to the end part of the flange part 22c on the tip part 22a side. In this manner, for example, at the time of insertion of the probe 2C into the holder hole 39 of the probe holder 3B shown in the fifth modification, when the cylindrical part 22b and the flange part 22c come near the second small-diameter part 39c, the outer diameters of the cylindrical part 22b and the flange part 22c will be reduced. Due to reduction of the outer diameter of the pipe member 22C, the probe 2C can be inserted into the holder hole 39 more easily. The length of the spring member 23 of the probe 2C in the natural state thereof in the central axis (axial line N) direction is preferably made larger than the length of the cylindrical part 22b in the central axis (axial line N) direction in order to reduce the diameter of the pipe member 22C.

(Seventh Modification of First Embodiment)

Figure 12:
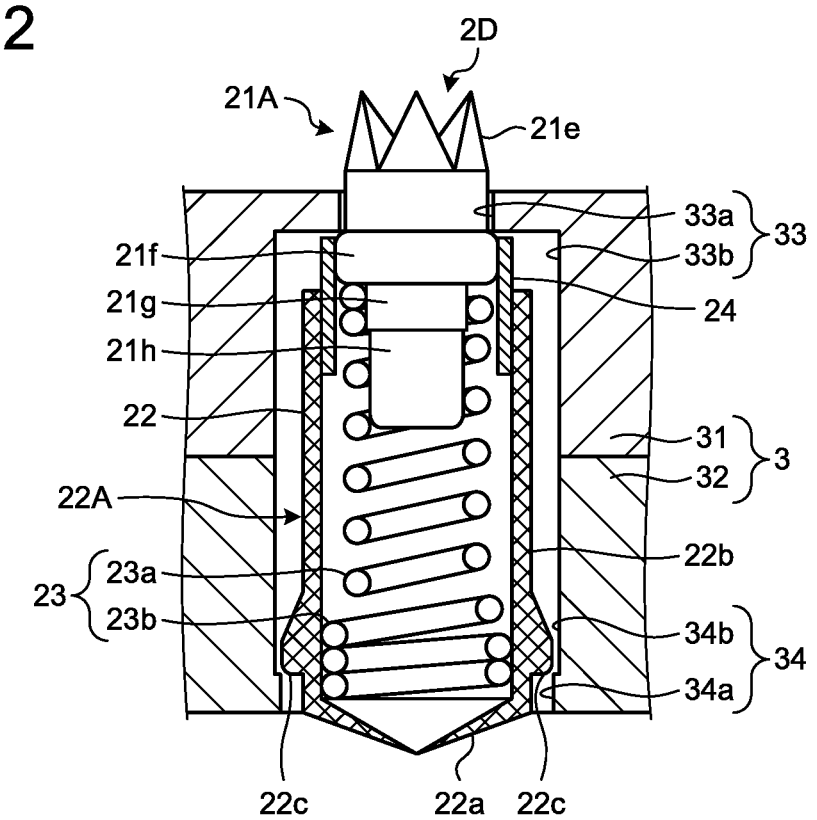
FIG. 12 is a partial sectional view illustrating a configuration of a contact probe according to a seventh modification of the first embodiment of the present disclosure.

FIG. 12 is a partial sectional view illustrating a configuration of a chief part of a probe unit according to a seventh modification of the first embodiment of the present disclosure. A probe 2D according to the seventh modification includes a plunger 21A instead of the plunger 21, and further includes a sleeve 24, as compared with the configuration of the probe 2 mentioned above. The rough wound part 23a of the spring member 23 and the small-diameter part 33a of the probe holder 3 have small diameters so as to conform with the plunger 21A.

The plunger 21A is such a plunger in which the outer diameter of the plunger 21 mentioned above is made small. The plunger 21A includes a tip part 21e having a crown shape, a flange part 21f having a larger diameter than the diameter of the tip part 21e, a boss part 21g into which an end part of the spring member 23 is press-fitted, extending to the opposite side to the tip part 21e with respect to the flange part 21f and having a smaller diameter than the flange part 21f does, and a base end part 21h extending to the opposite side to the flange part 21f with respect to the boss part 21g and having a diameter slightly smaller than that of the boss part 21g. The plunger 21A is movable in the axial line direction with expansion/contraction action of the spring member 23, and is biased in the direction of the semiconductor integrated circuit 100 with elastic force of the spring member 23, thereby contacting the electrode of the semiconductor integrated circuit 100.

The sleeve 24 is formed with a conductive material, and it has a cylindrical shape. The flange part 21f is press-fitted into the sleeve 24, and the outer surface of the sleeve 24 slidably contacts the cylindrical part 22b. At this time, the end part of the sleeve 24 on the tip part 21e side is positioned at the same position as the surface of the flange part 21f on the tip part 21e side, or is positioned on the base end side of that position. In addition, the sleeve 24 only needs to be coupled with the flange part 21f, and the sleeve 24 and the flange part 21f are only required to be at least fitted with each other such as being coupled by forming grooves that are fittable with each other in the inner circumference of the sleeve 24 and the outer circumference of the flange part 21f besides press fitting.

The flange part 21f of the plunger 21A abuts on the boundary wall surface between the small-diameter part 33a and the large-diameter part 33b of the holder hole 33 to provide a function to prevent the probe 2A from falling off from the probe holder 3.

When a load from the semiconductor integrated circuit 100 and the circuit board 200 is applied, the probe 2D mentioned above operates in the same manner as the probe 2 illustrated in FIG. 4A and FIG. 4B. When a load is applied to the probe 2D from the outside, the plunger 21A and the sleeve 24 integrally move, and the sleeve 24 slides on the cylindrical part 22b. A test signal that is supplied from the circuit board 200 to the semiconductor integrated circuit 100 at the time of test on the semiconductor integrated circuit 100 reaches the connection electrode of the semiconductor integrated circuit 100 from the electrode of the circuit board 200 via the pipe member 22, the sleeve 24, and the plunger 21A of the probe 2D. In this manner, since conduction is made via the plunger 21A, the sleeve 24, and the pipe member 22 in the probe 2D, a conduction path of the electrical signal can be minimized. In addition, also in the seventh modification, the probe 2D can be created without requiring swaging of the pipe member 22, and a diameter can be reduced in the configuration using the pipe member.

The spring member 23 of the seventh modification may have a configuration in which the rough wound part 23a is coupled with the sleeve 24, instead of a configuration in which the rough wound part 23a is coupled with the boss part 21g.

Furthermore, in the seventh modification, a flange may be provided in the outer circumference of the sleeve 24, and the flange may be caused to abut on the step part of the holder hole 33, so as to secure a function to prevent the probe 2A from falling off from the probe holder 3.

Second Embodiment

Figure 13:
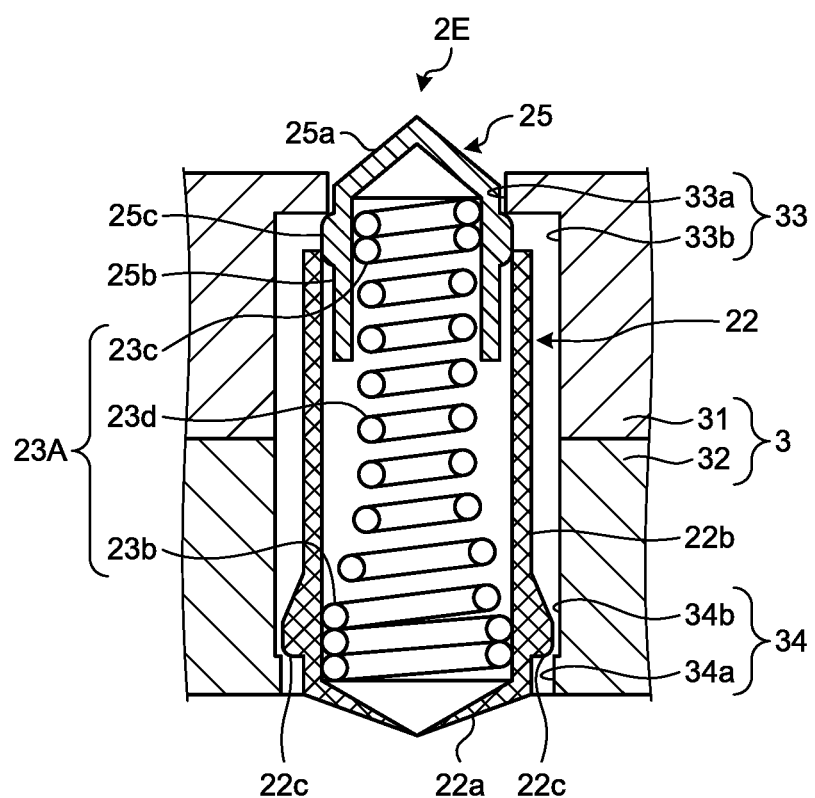
FIG. 13 is a partial sectional view illustrating a configuration of a chief part of a probe unit according to a second embodiment of the present disclosure.

FIG. 13 is a partial sectional view illustrating a configuration of a chief part of a probe unit according to a second embodiment of the present disclosure. In the first embodiment mentioned above, the probe 2 includes the plunger 21, the pipe member 22, and the spring member 23. However, it is not limited thereto. In the present second embodiment, a probe 2E includes two pipe members and a spring member.

The probe 2E includes a first pipe member 25, the pipe member 22 that is a second pipe member (hereinafter referred to as the second pipe member 22), and a spring member 23A.

The first pipe member 25 has a bottomed cylindrical shape. The first pipe member 25 includes a tip part 25a having a sharp end that abuts on the electrode formed on the semiconductor integrated circuit 100, a cylindrical part 25b having a cylindrical shape that extends from the base end of the tip part 25a, and a flange part 25c that projects from the outer surface of the cylindrical part 25b.

The tip part 25a has, for example, one and the same thickness. The thickness may become thinner or thicker toward the tip.

The diameter of the outer circumference of the cylindrical part 25b is smaller than the diameter of the inner circumference of the cylindrical part 22b.

The flange part 25c has a tapered shape in which the projection length becomes shorter from the tip part 25a side toward the opposite side. The maximum diameter of the flange part 25c is equal to or smaller than the diameter of the inner circumference of the cylindrical part 22b.

The spring member 23A is positioned in a hollow space that is formed with the first pipe member 25 and the second pipe member 22. In addition, the spring member 23A includes a first dense wound part 23c that is provided at the end part on the side abutting on the first pipe member 25, a rough wound part 23d that is wound at a predetermined pitch, and the dense wound part 23b that is a second dense wound part provided at the end part on the side abutting on the second pipe member 22 (hereinafter referred to as the second dense wound part 23b). The diameter of the outer circumference of the first dense wound part 23c is smaller than the diameter of the outer circumference of the second dense wound part 23b. The diameter of the outer circumference of the rough wound part 23d is smaller than the diameter of the outer circumference of the first dense wound part 23c or the second dense wound part 23b.

The spring member 23A is made by, for example, winding one and the same wire material, and when a load other than gravity force has not been applied, the diameter of the outer circumference of the first dense wound part 23c is equal to or larger than the diameter of the inner circumference of the cylindrical part 25b. The first dense wound part 23c is, for example, press-fitted into the inner peripheral surface in the vicinity of the boundary between the tip part 25a and the cylindrical part 25b. Meanwhile, the second dense wound part 23b is, for example, press-fitted into the inner peripheral surface in the vicinity of the boundary between the tip part 22a and the cylindrical part 22b. The first pipe member 25 and the spring member 23A are joined by pressure welding and/or soldering. In addition, the second pipe member 22 and the spring member 23A are joined by pressure welding and/or soldering.

When a load from the semiconductor integrated circuit 100 and the circuit board 200 is applied, the probe 2E mentioned above operates in the same manner as the probe 2 illustrated in FIG. 4A and FIG. 4B. A test signal that is supplied from the circuit board 200 to the semiconductor integrated circuit 100 at the time of test on the semiconductor integrated circuit 100 reaches the connection electrode of the semiconductor integrated circuit 100 from the electrode of the circuit board 200 via the second pipe member 22 and the first pipe member 25 of the probe 2E. In this manner, since conduction is made through the first pipe member 25 and the second pipe member 22 in the probe 2E, a conduction path of the electrical signal can be minimized.

According to the second embodiment mentioned above, in the probe 2E including the first pipe member 25, the second pipe member 22, and the spring member 23A, the spring member 23A is arranged inside the cylindrical part 22b having a uniform diameter, and the spring member 23A is coupled with the first pipe member 25. Thus, the probe 2E can be created without requiring swaging of the second pipe member 22, and a diameter can be reduced in the configuration using the pipe member. In the probe 2E according to the second embodiment, one end part of the spring member 23A is held by the cylindrical part 25b, and the other end part is held by the cylindrical part 22b. Thus, the spring member 23A prevents the first pipe member 25 from being detached from the second pipe member 22.

As described above, a contact probe and a probe unit according to the present disclosure are suitable in reducing a diameter in a configuration using a pipe member.

A contact probe according to the present disclosure exerts an effect that a reduced diameter can be achieved in a configuration using a pipe member.

The invention claimed is:

1. A contact probe comprising:
   a first contact member configured to contact a first contact target;
   a second contact member configured to
      contact a second contact target, and
      house at least a portion of the first contact member; and
   a spring member configured to couple the first contact member and the second contact member in a manner capable of expansion/contraction with both end parts of the spring member, wherein
   the spring member is wound in a helical shape, and at least a diameter of an outer circumference in one of the end parts held by the second contact member is larger than diameters of other portions,
   a diameter of an inner circumference of an end part of the second contact member on a side housing the first contact member is equal to or larger than a maximum diameter of the first contact member,
   the first contact member comprises:
      a first tip part configured to contact the first contact target; and
      a boss part configured to couple with the spring member by fitting into the spring member, and
   the second contact member comprises:
      a second tip part configured to contact the second contact target; and
      a cylindrical part extending from the second tip part and having a cylindrical shape with an inner circumference having a uniform diameter, the cylindrical part being engaged with at least a portion of the spring member, the portion of the spring member that is engaged with the cylindrical part having a diameter larger than the other portion of the spring member, the entire spring member being configured to be housed in the cylindrical part when the spring member is contracted.

2. The contact probe according to claim 1, wherein a length of the spring member in a natural state thereof in the axial line direction is smaller than a length of the cylindrical part in the axial line direction.

3. The contact probe according to claim 1, wherein a length of the spring member in a natural state thereof in the axial line direction is larger than a length of the cylindrical part in the axial line direction.

4. The contact probe according to claim 1, wherein
   the first contact member further comprises a first flange part provided at a base end of the first tip part, and
   the contact probe further comprises a sleeve into which the first flange part is fit, an outer surface of the sleeve slidably contacting the cylindrical part.

5. The contact probe according to claim 4, wherein an end part of the first flange part on an opposite side to a side continuous to the first tip part has a tapered shape.

6. The contact probe according to claim 1, wherein
   the spring member comprises:
      a rough wound part wound with a previously set gap, an inner circumference of the rough wound part contacting the first contact member; and a dense wound part extending from the rough wound part, an outer circumference of the dense part contacting the cylindrical part, and a diameter of the dense wound part is larger than a diameter of the rough wound part.

7. A probe unit comprising:
the contact probe according to claim 1; and
a probe holder including a holder hole configured to hold the contact probe.

8. The probe unit according to claim 7, wherein
the first contact member comprises a flange part having a maximum diameter of the first contact member, and
when the contact probe is held by the probe holder, at least a portion of the flange part is positioned inside the second contact member.

9. The probe unit according to claim 7, wherein
the first contact member comprises a flange part having a maximum diameter of the first contact member, and
when the contact probe is held by the probe holder, the flange part is positioned outside the second contact member.

10. The probe unit according to claim 7, wherein the probe holder is made of a single plate.

11. The probe unit according to claim 10, wherein the second contact member further comprises a slit extending from the end part of the cylindrical part on an opposite side of the tip part is formed in the cylindrical part.

12. A contact probe comprising:
a first contact member configured to contact a first contact target;
a second contact member configured to
contact a second contact target, and
house at least a portion of the first contact member; and
a spring member configured to couple the first contact member and the second contact member in a manner capable of expansion/contraction with both end parts of the spring member, wherein
the spring member is wound in a helical shape, and at least a diameter of an outer circumference in one of the end parts held by the second contact member is larger than diameters of other portions, a diameter of an inner circumference of an end part of the second contact member on a side housing the first contact member is equal to or larger than a maximum diameter of the first contact member, the first contact member comprises:
a first tip part configured to contact the first contact target; and
a first cylindrical part extending from the first tip part in a cylindrical shape, and the second contact member comprises:
a second tip part configured to contact the second contact target; and
a second cylindrical part extending from the second tip part and having a cylindrical shape with an inner circumference having a uniform diameter, and the spring member is positioned in a hollow space formed with the first and the second cylindrical parts.

13. The contact probe according to claim 12, wherein
the spring member comprises:
a first dense wound part, an outer circumference of the first dense wound part contacting the first cylindrical part;
a rough wound part wound with a previously set gap, the rough wound part extending from the first dense wound part; and
a second dense wound part, an outer circumference that of the second dense wound part contacting the second cylindrical part, and the second dense wound part being provided at an end part of the rough wound part on an opposite side of the first dense wound part, a diameter of the first dense wound part is smaller than a diameter of the second dense wound part, and a diameter of the rough wound part is smaller than the diameter of the first dense wound part.

14. A probe unit comprising:
the contact probe according to claim 12; and
a probe holder including a holder hole configured to hold the contact probe.

* * * * *